US011646175B2

United States Patent
DeLuca et al.

(10) Patent No.: US 11,646,175 B2
(45) Date of Patent: May 9, 2023

(54) METHOD OF MIXING UPSTREAM AND DOWNSTREAM CURRENT MEASUREMENTS FOR INFERENCE OF THE BEAM CURRENT AT THE BEND OF AN OPTICAL ELEMENT FOR REALTIME DOSE CONTROL

(71) Applicant: Axcelis Technologies, Inc., Beverly, MA (US)

(72) Inventors: James DeLuca, Beverly, MA (US); Andy Ray, Newburyport, MA (US); Neil Demario, Fort Myers, FL (US); Rosario Mollica, Ipswich, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 314 days.

(21) Appl. No.: 16/791,308

(22) Filed: Feb. 14, 2020

(65) Prior Publication Data
US 2020/0266032 A1    Aug. 20, 2020

Related U.S. Application Data

(60) Provisional application No. 62/806,173, filed on Feb. 15, 2019.

(51) Int. Cl.
*H01J 37/317*    (2006.01)
*H01J 37/05*     (2006.01)
(Continued)

(52) U.S. Cl.
CPC ......... *H01J 37/3171* (2013.01); *H01J 37/05* (2013.01); *H01J 37/243* (2013.01); *H01J 37/244* (2013.01);
(Continued)

(58) Field of Classification Search
CPC ........ H01J 37/05; H01J 37/244; H01J 37/243; H01J 37/304; H01J 37/32357;
(Continued)

(56) References Cited

U.S. PATENT DOCUMENTS 5,760,409 A    6/1998   Chen
8,692,216 B2 * 4/2014   Kariya ................ H01J 37/3171
                                                  250/397
(Continued)

OTHER PUBLICATIONS

International Search Report and Written Opinion dated Aug. 5, 2020 in connection with International Patent Application PCT/US2020/018516.

*Primary Examiner* — Wyatt A Stoffa
(74) *Attorney, Agent, or Firm* — Eschweiler & Potashnik, LLC

(57) ABSTRACT

An ion implantation has an ion source and a mass analyzer configured to form and mass analyze an ion beam. A bending element is positioned downstream of the mass analyzer, and respective first and second measurement apparatuses are positioned downstream and upstream of the bending element and configured to determine a respective first and second ion beam current of the ion beam. A workpiece scanning apparatus scans the workpiece through the ion beam. A controller is configured to determine an implant current of the ion beam at the workpiece and to control the workpiece scanning apparatus to control a scan velocity of the workpiece based on the implant current. The determination of the implant current of the ion beam is based, at least in part, on the first ion beam current and second ion beam current.

19 Claims, 5 Drawing Sheets

(51) Int. Cl.
  *H01J 37/304*    (2006.01)
  *H01J 37/244*    (2006.01)
  *H01J 37/24*     (2006.01)
  *H01J 37/32*     (2006.01)

(52) U.S. Cl.
  CPC ....... *H01J 37/304* (2013.01); *H01J 37/32357* (2013.01); *H01J 2237/24535* (2013.01); *H01J 2237/31701* (2013.01)

(58) Field of Classification Search
  CPC ......... H01J 37/3171; H01J 2237/24535; H01J 2237/31701; H01J 2237/31703
  See application file for complete search history.

(56) References Cited

U.S. PATENT DOCUMENTS

| | | | | |
|---|---|---|---|---|
| 9,287,085 B2* | 3/2016 | Allen | ................ | H01J 37/32412 |
| 9,412,561 B2* | 8/2016 | Kurose | ............... | H01J 37/3171 |
| 9,502,210 B2* | 11/2016 | Sano | ..................... | H01J 37/244 |
| 9,646,837 B2* | 5/2017 | Ninomiya | ............ | H01J 37/3171 |
| 10,283,422 B2* | 5/2019 | Kariya | .................. | H01J 37/244 |
| 10,658,156 B1* | 5/2020 | Todorov | .................. | H01J 37/3023 |
| 10,672,586 B2* | 6/2020 | Kawatsu | ............. | H01J 37/1474 |
| 2005/0269526 A1 | 12/2005 | Rathmell | | |
| 2007/0278427 A1* | 12/2007 | Huang | .................. | H01J 37/304 250/492.21 |
| 2010/0065761 A1 | 3/2010 | Graf | | |
| 2013/0001433 A1* | 1/2013 | Lin | ...................... | H01J 37/304 250/398 |
| 2014/0065737 A1* | 3/2014 | Ninomiya | ............... | H01J 37/304 118/712 |
| 2015/0311077 A1* | 10/2015 | Kurose | ................. | H01J 37/304 250/354.1 |
| 2016/0042915 A1* | 2/2016 | Sano | ..................... | H01J 37/244 250/492.3 |
| 2016/0189926 A1* | 6/2016 | Ray | ..................... | H01J 37/3171 250/492.21 |
| 2017/0092464 A1* | 3/2017 | Ninomiya | ........... | H01J 37/3171 |
| 2018/0068829 A1* | 3/2018 | Ishibashi | ............. | H01L 21/265 |

* cited by examiner

METHOD OF MIXING UPSTREAM AND DOWNSTREAM CURRENT MEASUREMENTS FOR INFERENCE OF THE BEAM CURRENT AT THE BEND OF AN OPTICAL ELEMENT FOR REALTIME DOSE CONTROL

REFERENCE TO RELATED APPLICATIONS

This application claims the benefit of U.S. Provisional Application No. 62/806,173 filed Feb. 15, 2019, entitled "A METHOD OF MIXING UPSTREAM AND DOWNSTREAM CURRENT MEASUREMENTS FOR INFERENCE OF THE BEAM CURRENT AT THE BEND OF AN OPTICAL ELEMENT FOR REALTIME DOSE CONTROL", the contents of which are herein incorporated by reference in their entirety.

TECHNICAL FIELD

The present invention relates generally to ion implantation systems, and more specifically to systems and methods for determining current of an ion beam for controlling a dosage of ions during implantation.

BACKGROUND

In the manufacture of semiconductor devices, ion implantation is used to dope semiconductors with impurities. Ion implantation systems are often utilized to dope a workpiece, such as a semiconductor wafer, with ions from an ion beam, in order to either produce n- or p-type material doping, or to form passivation layers during fabrication of an integrated circuit. Such beam treatment is often used to selectively implant the wafers with impurities of a specified dopant material, at a predetermined energy level, and in controlled concentration, to produce a semiconductor material during fabrication of an integrated circuit. When used for doping semiconductor wafers, the ion implantation system injects a selected ion species into the workpiece to produce the desired extrinsic material. Implanting ions generated from source materials such as antimony, arsenic, or phosphorus, for example, results in an "n-type" extrinsic material wafer, whereas a "p-type" extrinsic material wafer often results from ions generated with source materials such as boron, gallium, or indium.

A typical ion implanter includes an ion source, an ion extraction device, a mass analysis device, a beam transport device and a wafer processing device. The ion source generates ions of desired atomic or molecular dopant species. These ions are extracted from the source by an extraction system, typically a set of electrodes, which energize and direct the flow of ions from the source, forming an ion beam. Desired ions are separated from the ion beam in a mass analysis device, typically a magnetic dipole performing mass dispersion or separation of the extracted ion beam. The beam transport device, typically a vacuum system containing a series of focusing devices, transports the ion beam to the wafer processing device while maintaining desired properties of the ion beam. Finally, semiconductor wafers are transferred in to and out of the wafer processing device via a wafer handling system, which may include one or more robotic arms, for placing a wafer to be treated in front of the ion beam and removing treated wafers from the ion implanter.

SUMMARY

Aspects of the disclosure facilitate ion implantation processes for mitigating variation in ion dosage concurrent with implanting ions into a workpiece. According to one exemplary aspect, an ion implantation system is provided having an ion source configured to form an ion beam, a beamline assembly configured to selectively transport the ion beam, and an end station is configured to accept the ion beam for implantation of ions into a workpiece.

In accordance with one exemplary aspect, an ion implantation system is provided, wherein an ion source is provided and configured to form an ion beam. A mass analyzer, for example, is further provided and configured to mass analyze the ion beam. A bending element, such as an energy filter, is positioned downstream of the mass analyzer, whereby the bending element is configured to alter a path of the ion beam. A first measurement apparatus, for example, is positioned downstream of the bending element and configured to determine a first ion beam current of the ion beam. Further, a second measurement apparatus positioned upstream of the bending element and configured to determine a second ion beam current of the ion beam. A workpiece scanning apparatus is further provided and configured to scan the workpiece through the ion beam, whereby a controller is configured to determine an implant current of the ion beam at the workpiece and to control the workpiece scanning apparatus to control a scan velocity of the workpiece based on the implant current. The determination of the implant current of the ion beam, for example, is based, at least in part, on the first ion beam current and second ion beam current.

In accordance with one example, one or more of the first measurement apparatus and second measurement apparatus comprise one or more of a faraday, a terminal return current measurement apparatus, and an energy filter current measurement apparatus. The one or more of the first measurement apparatus and second measurement apparatus, for example, can comprise a device configured to compare a terminal current associated with a terminal of the ion source and an energy filter current associated with the energy filter.

In another example, the first measurement apparatus can comprise one or more faradays positioned downstream of the bending element, such as two faradays positioned downstream of the bending element on opposing sides of the ion beam.

In yet another example, a beam scanning apparatus may be further provided and configured to scan the ion beam along one or more axes.

The controller, for example, may be further configured to determine the implant current by determining an average of the first ion beam current and second ion beam current. The controller can be further configured to determine the implant current by weighting the average of the first ion beam current and second ion beam current. In another example, the controller can be configured to implement a software compensation factor to further control the scan velocity of the workpiece. The controller, in another example, can be configured to repeatedly determine the implant current at a predetermined rate, and wherein the scan velocity is updated at the predetermined rate, such as on the order of once every 1-50 milliseconds.

In accordance with another example of the present disclosure, a method is provided for ion implantation of a workpiece, where an ion beam is formed and mass analyzed. After mass analyzing the ion beam, for example, a path of the ion beam is altered, such as being bent. In accordance with one example, a first ion beam current of the ion beam is determined or measured after bending of the ion beam, and a second ion beam current of the ion beam is determined or measured before the bending of the ion beam. An implant current of the ion beam at the workpiece is further determined based, at least in part, on the first ion beam current and second ion beam current. Further, a velocity of scanning of the workpiece through the ion beam can be controlled based, at least in part, on the determined implant current.

The above summary is merely intended to give a brief overview of some features of some embodiments of the present disclosure, and other embodiments may comprise additional and/or different features than the ones mentioned above. In particular, this summary is not to be construed to be limiting the scope of the present application. Thus, to the accomplishment of the foregoing and related ends, the disclosure comprises the features hereinafter described and particularly pointed out in the claims. The following description and the annexed drawings set forth in detail certain illustrative embodiments of the disclosure. These embodiments are indicative, however, of a few of the various ways in which the principles of the disclosure may be employed. Other objects, advantages and novel features of the disclosure will become apparent from the following detailed description of the disclosure when considered in conjunction with the drawings.

DETAILED DESCRIPTION

Figure 1:
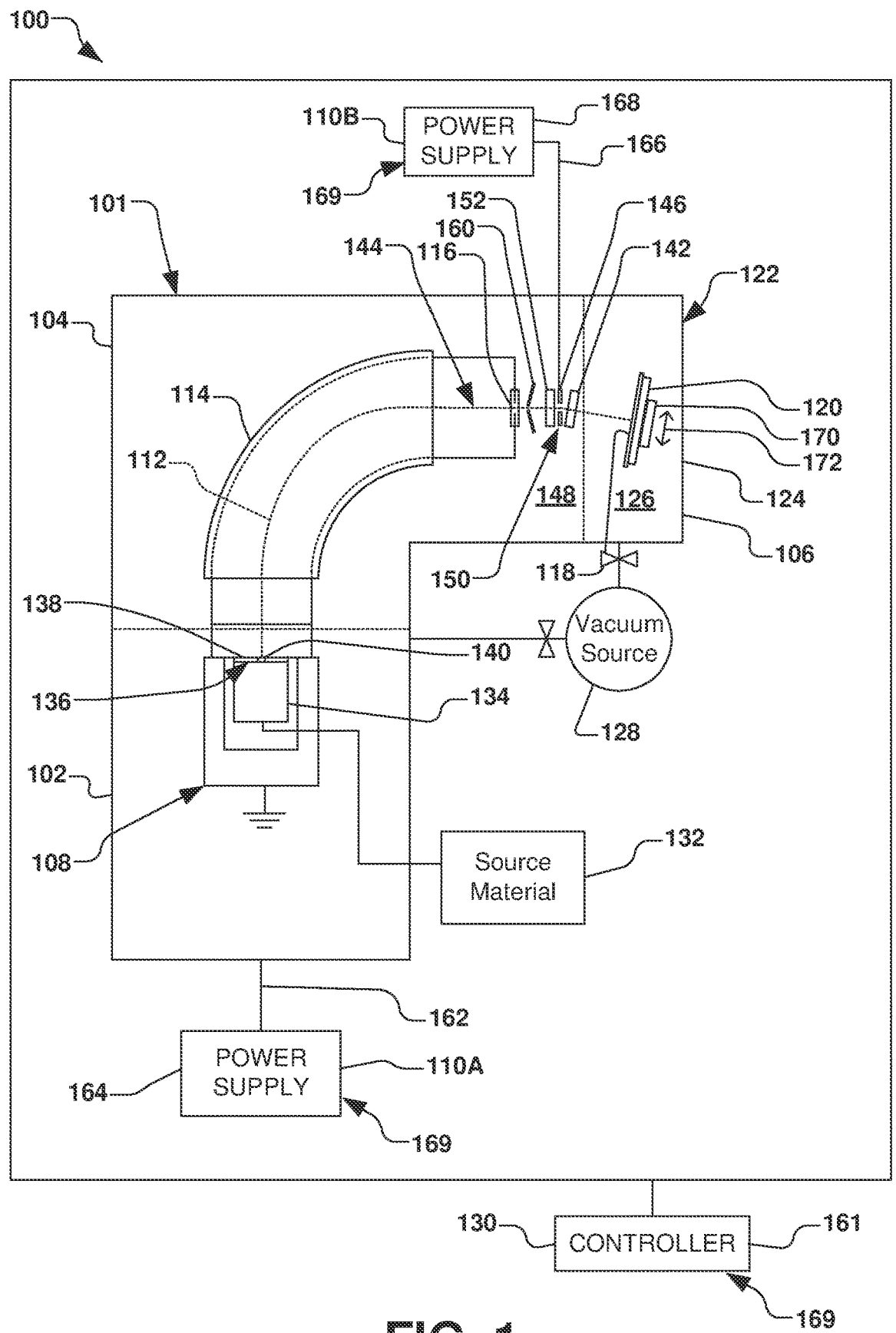
FIG. 1 is a block diagram of an exemplary vacuum system in accordance with several aspects of the present disclosure.

The present disclosure is directed generally toward an ion implantation system methods for determining current of an ion beam for controlling a dosage during implantation. Accordingly, the present invention will now be described with reference to the drawings, wherein like reference numerals may be used to refer to like elements throughout. It is to be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details. Further, the scope of the invention is not intended to be limited by the embodiments or examples described hereinafter with reference to the accompanying drawings, but is intended to be only limited by the appended claims and equivalents thereof.

It is also noted that the drawings are provided to give an illustration of some aspects of embodiments of the present disclosure and therefore are to be regarded as schematic only. In particular, the elements shown in the drawings are not necessarily to scale with each other, and the placement of various elements in the drawings is chosen to provide a clear understanding of the respective embodiment and is not to be construed as necessarily being a representation of the actual relative locations of the various components in implementations according to an embodiment of the invention. Furthermore, the features of the various embodiments and examples described herein may be combined with each other unless specifically noted otherwise.

It is also to be understood that in the following description, any direct connection or coupling between functional blocks, devices, components, circuit elements or other physical or functional units shown in the drawings or described herein could also be implemented by an indirect connection or coupling. Furthermore, it is to be appreciated that functional blocks or units shown in the drawings may be implemented as separate features or circuits in one embodiment, and may also or alternatively be fully or partially implemented in a common feature or circuit in another embodiment. For example, several functional blocks may be implemented as software running on a common processor, such as a signal processor. It is further to be understood that any connection which is described as being wire-based in the following specification may also be implemented as a wireless communication, unless noted to the contrary.

In general, an ion implanter can include an ion source, an ion extraction device, a mass analysis device, a beam transport device and a workpiece processing device. The ion source generates ions of desired atomic or molecular dopant species. These ions are extracted from the ion source by the ion extraction device, which can comprise a set of electrodes that energize and direct the flow of ions from the ion source, thus forming an ion beam. Desired ions are separated from the ion beam in the mass analysis device, which can comprise a magnetic dipole performing mass dispersion or separation of the extracted ion beam. The beam transport device, such as a vacuum system containing a series of focusing devices, transports the ion beam to the workpiece processing device, while maintaining desired properties of the ion beam. Finally, workpieces (e.g., semiconductor wafers) are transferred in to and out of the workpiece processing device via a workpiece handling system, which may include one or more robotic arms configured to place a workpiece to be treated in front of the ion beam and removing treated workpieces from the ion implanter.

An ion implanter can further include an optical element in relatively close proximity to the workpiece for the purpose of filtering the ion beam through a final bend in the beamline. It is non-trivial, however, to measure the ion flux of the ion beam at the location of the final bend in the beamline. As a result, some software compensation is applied to a beam current measurement to account for a fraction of energetic neutrals that may exist between the optical element and the beam current measurement device (e.g., either upstream or downstream of the optical element).

This present disclosure provides a system and method for attaining and utilizing beam current measurements both before and after an optical element in order to infer the beam current at a final bend in the optical element. The beam current measurements, for example, can be utilized for the purpose of controlling an exposure time of the workpiece to the ion beam (e.g., via a control of a scanning of the workpiece through the ion beam) in order to accumulate a desired dopant density profile.

In order to gain a better understanding of the present disclosure, FIG. 1 illustrates an exemplary vacuum system 100. The vacuum system 100 in the present example comprises an ion implantation system 101, however various other types of vacuum systems are also contemplated, such as plasma processing systems, or other semiconductor processing systems. The ion implantation system 101, for example, comprises a terminal 102, a beamline assembly 104, and an end station 106. Generally speaking, an ion source assembly 108 in the terminal 102 is coupled to a power supply 110 to ionize a dopant material into a plurality of ions from the ion source assembly to form an ion beam 112.

The ion beam 112 in the present example is directed through a mass analyzer 114 (e.g., also referred to as a beam-steering apparatus), and out an aperture 116 towards the end station 106. In the end station 106, the ion beam 112 bombards a workpiece 118 (e.g., a semiconductor such as a silicon wafer, a display panel, etc.), which is selectively clamped or mounted to a chuck 120 (e.g., an electrostatic chuck or ESC). Once embedded into the lattice of the workpiece 118, the implanted ions change the physical and/or chemical properties of the workpiece. Because of this, ion implantation is used in semiconductor device fabrication and in metal finishing, as well as various applications in materials science research.

The ion beam 112 of the present disclosure can take any form, such as a pencil or spot beam, a ribbon beam, a scanned beam, or any other form in which ions are directed toward end station 106, and all such forms are contemplated as falling within the scope of the disclosure. According to one exemplary aspect, the end station 106 comprises a process chamber 122, such as a vacuum chamber 124, wherein a process environment 126 is associated with the process chamber. The process environment 126 generally exists within the process chamber 122, and in one example, comprises a vacuum produced by a vacuum source 128 (e.g., a vacuum pump) coupled to the process chamber and configured to substantially evacuate the process chamber. The vacuum source 128 may comprise one or more vacuum pumps operably coupled to one of more of the terminal 102, beamline assembly 104, and end station 106 for selective evacuation, thereof. Further, a controller 130 is provided for selective control of the vacuum system 100.

According to the present disclosure, an ion source material 132 is provided to an arc chamber 134 of the ion source assembly 108 for the production of ions associated with the ion beam 112. The ion source material 132, for example, may comprise various dopant species, and may be provided in gaseous or solid form to the arc chamber. For example, an extraction electrode assembly 136 comprising one or more electrodes 138 is provided to extract ions from the ion source assembly 108 through an extraction aperture 140, whereby the one or more electrodes (not shown) in close proximity to the extraction aperture may be biased to inhibit back streaming of neutralizing electrons close to the ion source assembly, or back to the extraction electrode.

In accordance with one example, a first beam current measurement device 142 (e.g., a faraday cup) is provided along a path 144 of the ion beam 112, wherein the first beam current measurement device is configured to measure ion beam current at a position between an optical element 146 (e.g., a final bending element along the path of the ion beam) and the workpiece 118. Ion beam current is known to attenuate through a residual gas following behavior of the form, $$dI \approx -In\sigma dx \qquad (1),$$

where I is the beam current entering a region, n is the residual gas density, sigma ($\sigma$) is the cross-section for charge exchange and dx is the path length of the ion through a residual gas 148 (e.g., outgassed photoresist material from the workpiece 118) that may be present. At higher energies, stripping reactions may cause a measured increase in ion beam current (e.g., charge collected at the first beam current measurement device 142). However, for low energy, high current ion implanters, the dominant effect is from a neutralization of ions such that they are not counted at the first beam current measurement device 142 between the optical element 146 and the workpiece 118.

The present disclosure describes a system and method of using beam current measurements taken both before and after the optical element 146 along the path 144 of the ion beam 112 in order to infer the beam current at a final optical bend 150 associated with the optical element, whereby an exposure time of the workpiece 118 to the ion beam is controlled in order to accumulate a desired dopant density profile at the workpiece.

Absent countermeasures, neutrals (not shown) in the ion beam 112 that are present between the optical element 146 and the first beam current measurement device 142 will generally follow a line-of-sight path to the workpiece 118, thus producing a possibility of an over-dose. The present disclosure appreciates that if the residual gas 148 propagates upstream of the optical element 146, for example, then ignoring the change to the beam current observed at the first beam current measurement device 142 will have a tendency to produce an under-dose, since any neutrals born before the optical element may be filtered from the ion beam 112 before reaching the workpiece 118.

Accordingly, the present disclosure provides a second beam current measurement device 152 (e.g., a faraday cup or a "real-time" beam current measurement device) upstream of the final optical bend 150 along the path 144 to provide an inference of the ion current at the position of the final optical bend in order to better control the implanted dose of ions into the workpiece 118. Beam current measurements attained at the first beam current measurement device 142 and second beam current measurement device 152 immediately after and before the final optical bend 150 (e.g., in close proximity to the respective exit and entrance of the final optical bend), for example, may be mathematically utilized (e.g., averaged) to infer a change in the beam current at the final optical bend. However, when architectures provide a non-trivial length along the path 144 between each of the first and second beam current measurement devices 142, 152 and the final optical bend 150, a weighting function may be included in order to account for differences in ion neutralization before and after the final optical bend. Such a weighting function, for example, provides the operator of the ion implantation system 101 to adjust the impact of each measurement variation on the required workpiece scanning velocity in order to maintain dose uniformity.

Figure 2:
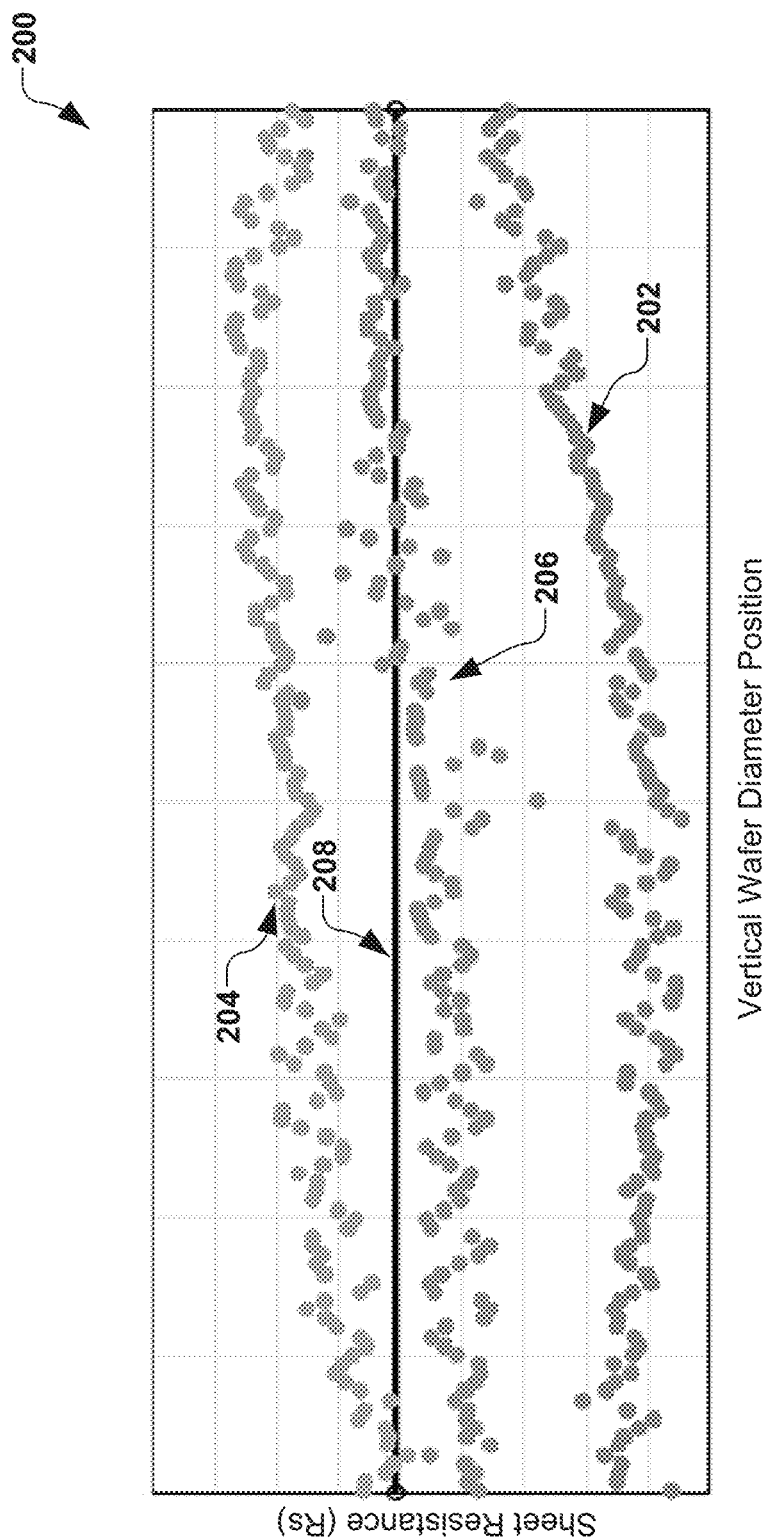
FIG. 2 is a graph illustrating upstream and downstream weight tuning according to one example.

FIG. 2 illustrates an example graph 200 showing a first weighting 202 (e.g., upstream=0, downstream=1), a second weighting 204 (e.g., upstream=1, downstream=2), and a third weighting 206 (e.g., upstream=0.5, downstream=2). A default of weighting of all three measurements evenly such that a higher net weighting is given to the downstream measurement (by a design choice of two downstream measurements in this example) is sufficient to match a bare wafer sheet resistance Rs target 208 within 1%. Using a linear fitting of the wafer sheet resistance Rs measured across a vertical diameter of a photoresist-coated wafer with an open stripe across its diameter aligned with the vertical scan of the wafer, for example, an optimized upstream weight of 0.65 and a downstream weight of 2 is given to match the bare wafer reference (e.g., an even weight of 1 for each of the two downstream measurements taken).

In accordance with one example, a real-time federate $Feed_{Mod}$ modification the scan velocity of the workpiece 118 through the ion beam 112 of FIG. 1 may be determined based on a downstream beam current $I_{Down}$ measured in real time by the first beam current measurement device 142, an upstream beam current $I_{Up}$ measured in real time by the second beam current measurement device 152, a downstream reference beam current $I_{RefDown}$, and an upstream reference beam current $I_{RefUp}$, along with a downstream weighting factor $WF_{Down}$ and an upstream weighting factor $WF_{Up}$ as, $$Feed_{Mod} = \frac{\left(\frac{I_{Down} \times WF_{Down}}{I_{RefDown}}\right) + \left(\frac{I_{Up} \times WF_{Up}}{I_{RefUp}}\right)}{(WF_{Down} + WF_{Up})}. \quad (2)$$

Figure 3:
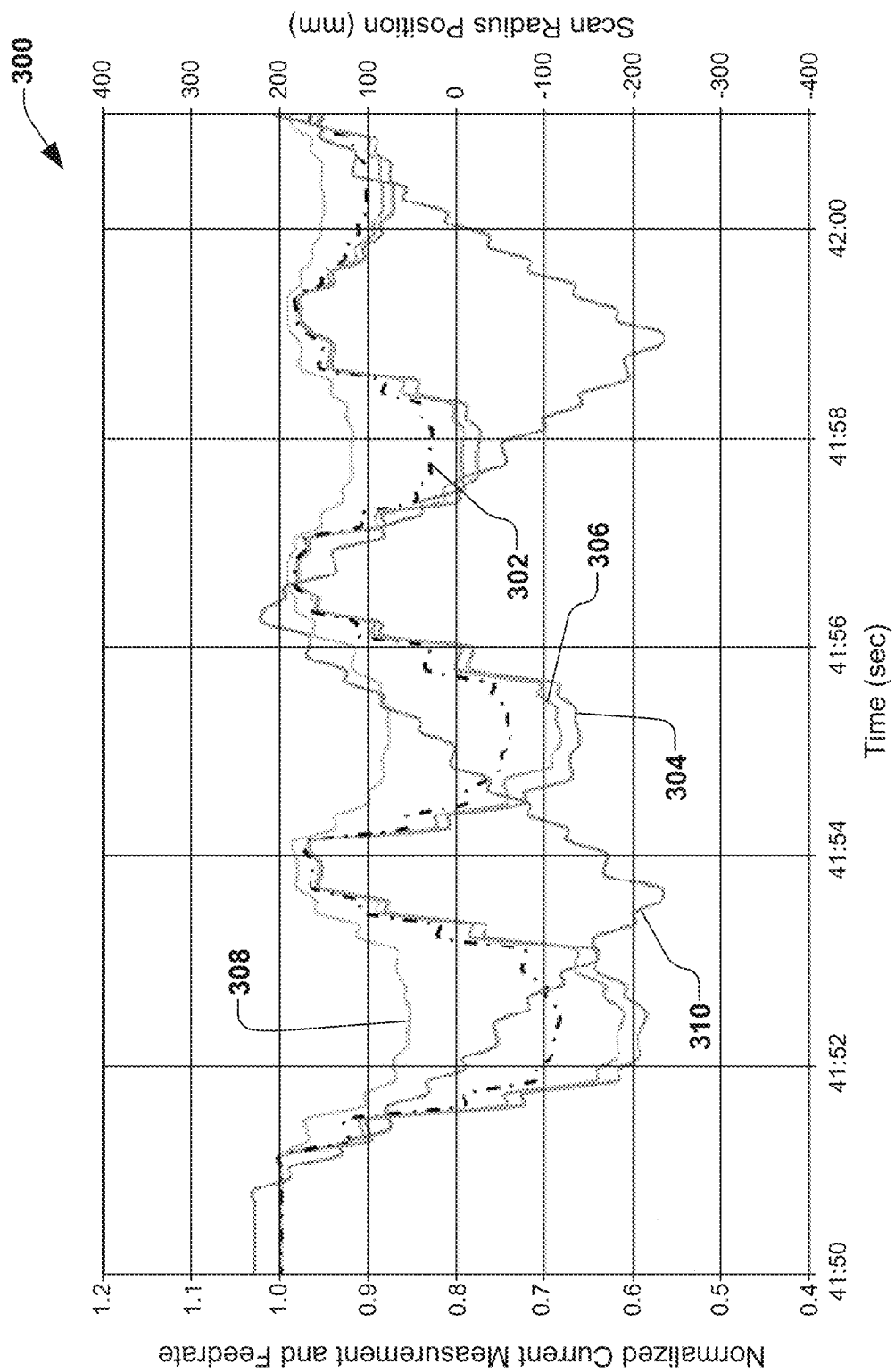
FIG. 3 is a graph illustrating an example variation in beam current measured at various distances before and after an optical bend while passing a photoresist-coated workpiece through a high power ion beam.

A plot 300 is illustrated in FIG. 3 showing an example of controlling dosage of an ion implantation via a real-time modification 302 to the scan velocity associated with a first downstream beam current 304, a second downstream beam current 306, an upstream beam current 308, and a scan radius position 310 of the center of the workpiece with respect to the center of the ion beam. FIG. 3, for example, is illustrative of a so-called "feed rate", which is a normalized adjustment to the real-time velocity of the workpiece through the ion beam based on the weighted average change in beam current as measured at the three locations.

In this example, weighting is accomplished by utilizing two measurements of downstream beam current $I_{Down}$ and one measurement of upstream beam current $I_{Up}$. The present disclosure appreciates that greater evenness in weighting and less variation in weighting across ion species, energy, and/or deceleration space of the ion beam 112 can be achieved by placement of the first beam current measurement device 142 and second beam current measurement device 152 of FIG. 1 as close as possible to the final optical bend 150. As the positions of the first beam current measurement device 142 and second beam current measurement device 152 extend away from the final optical bend 150, software weighting may be determined via empirical sheet resistance Rs matching of results attained by photoresist-striped wafers to those of bare wafers in order to infer a relative fraction of neutrals that are formed before and after the final optical bend.

Figure 4:
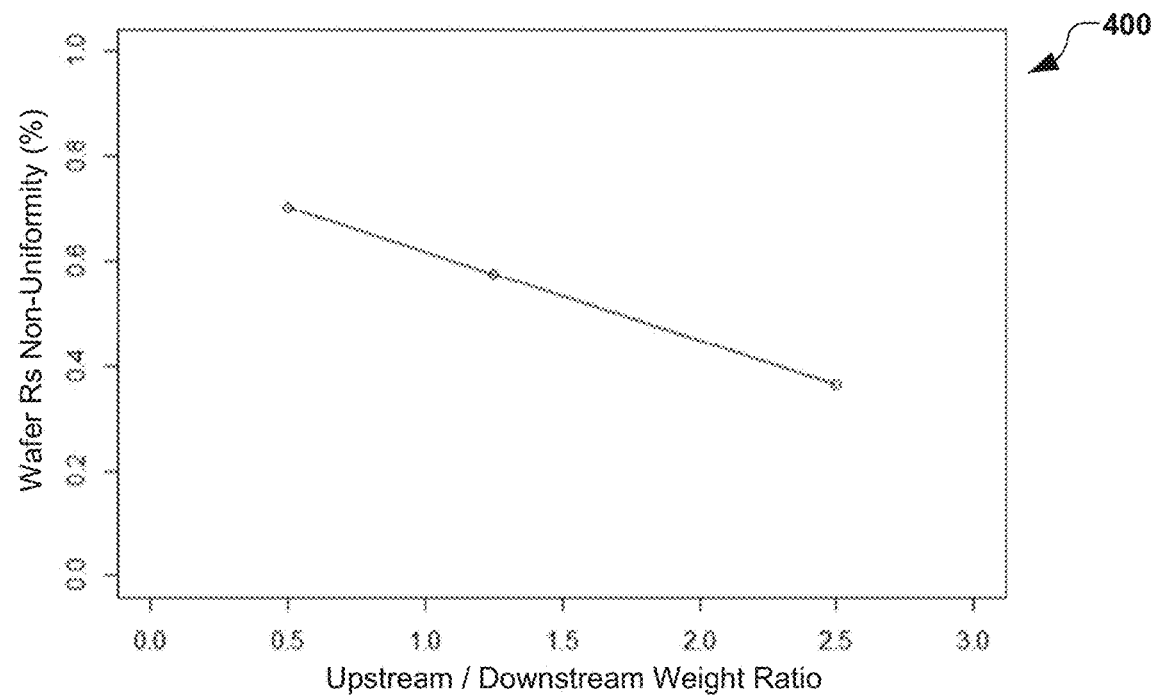
FIG. 4 is a graph illustrating an example empirical control of a weighting applied to beam current changes for real time velocity control of a translation of a workpiece through an ion beam.
Figure 5:
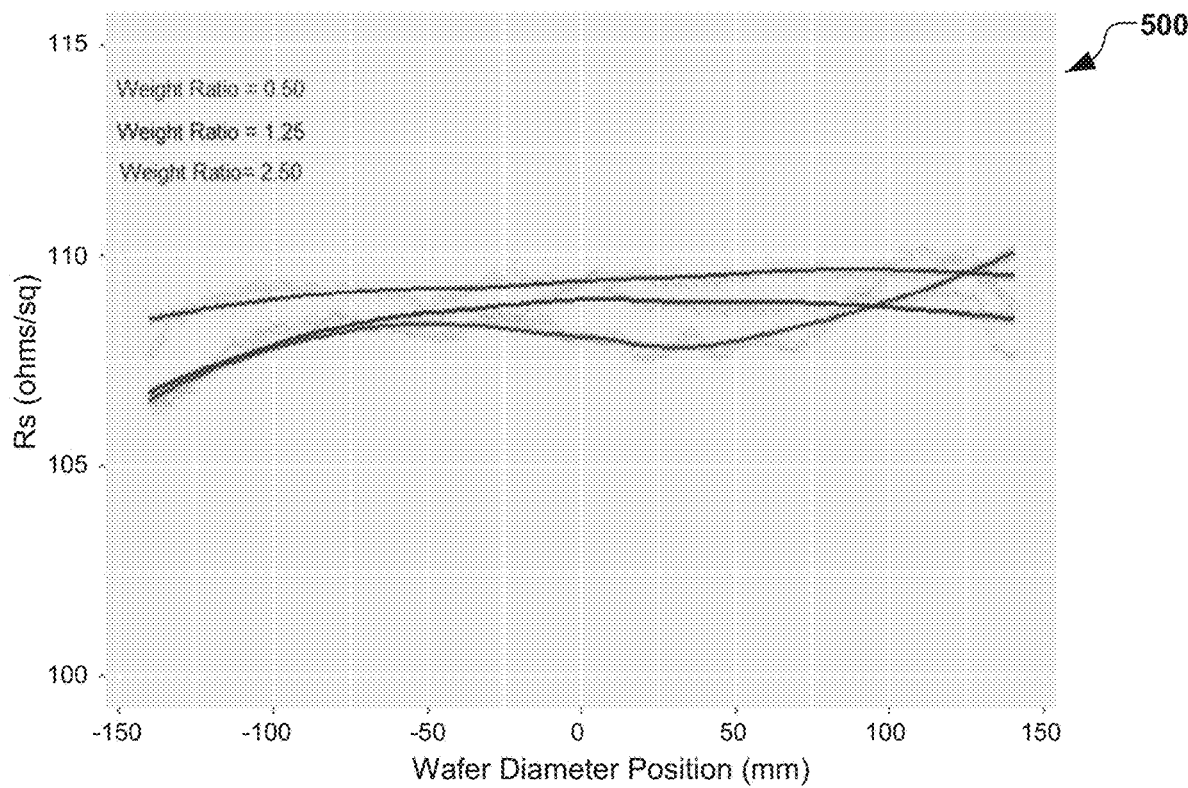
FIG. 5 is an example graph illustrating a cross-wafer uniformity measured in a narrow open stripe across a workpiece for determining non-uniformity.

FIGS. 4-5 illustrate exemplified graphs 400, 500 for a method of fine tuning a ratio of the downstream weighting factor $WF_{Down}$ and upstream weighting factor $WF_{Up}$ for Equation (2). In this example, three Rs monitor wafers are coated with photoresist, and a narrow stripe is opened in the photoresist along the diameter of each wafer, whereby the narrow stripe is aligned with the direction that the wafer will travel or be scanned through the ion beam. Each wafer is implanted at a different ratio of the upstream and downstream weighting factor $WF_{Up}$ and $WF_{Down}$ measurements with a high power beam.

FIG. 5 illustrates the Rs measurements collected across the diameter of the wafer used to calculate the non-uniformity in dosage as, $$100\% \times Rs\ Standard\ Deviation/Rs\ Mean \quad (3).$$

FIG. 4 illustrates the linear trend in dosage non-uniformity, which is then used to find the weight ratio meeting a desired target (e.g., <0.5% non-uniformity). In one example embodiment, this method could be applied over a framework of conditions to provide a background table to automatically populate appropriate weights for a production ion implantation system via linear interpolation. In another example embodiment, these weights could be fine-tuned to match an arbitrary non-uniformity profile for particular desires in a production environment in order to match a characteristic non-uniformity of some pre-existing Tool of Record.

The present disclosure further appreciates that photoresist dose control may be utilized for various ion implantation devices. In order to accommodate variations associated with such photoresist dose control, the present disclosure, for example, can measure the beam current downstream of the final optical bend 150 of FIG. 1, and then do one of the following: (a) ignore the photoresist outgassing effect; (b) measure a pressure rise on a pressure gauge and compensate the scan speed by the pressure change; or (c) measure a current rise on a biased aperture near the bend to infer an amount of neutralization at the bend to compensate the scan speed.

In one example, the present disclosure directly measures the beam current before and after the final optical bend 150 such that the operator of the ion implantation system 101, for example, may decide that the default weighting that comes from the hardware design (e.g., location and number of faradays of the first and second beam current measurement devices 142, 152) is sufficient to match the photoresist-coated workpiece 118 to a bare wafer without fine tuning of various other available software weighting functions.

When a conventional ion implantation system had experienced higher than desired dose variation, for example, a modification to the nominal scan velocity was made to accumulate the dose. However, such a modification only accounts for locations upstream in the beamline where the injected ion beam coming from the source changes over time, and such a modification does not address a larger issue concerning focusing element(s) that filter the ion beam near the workpiece. When a photoresist on the workpiece outgasses, for example, there is some charge exchange, and some of the ions that neutralize thus have line-of-sight to the workpiece, while other non-neutral ions do not.

Typically, ion implanters measure the ion beam current in a line-of-sight position to the workpiece. As a result, software compensation (also called a software compensation factor) has been used. For ion implanters that have an energy filter near the workpiece, it is desirable to have a mechanism for determining the beam current, once the ion beam reaches the workpiece during implantation. In older generations, with straight line-of-sight to the entire workpiece at the beamline, the beam current could be ignored as the workpiece was moved vertically, as a pressure response to outgassing from photoresist on the workpiece would neutralize the beam, and where all of the neutrals would get to the wafer. However, when an energy filter is implemented in the ion implanter, such neutralization impacts the ion beam, both where the ion beam has line-of-sight to the workpiece, as well as where the ion beam has no such line-of-sight.

A software compensation factor has been utilized to consider the pressure response, and/or the ion beam current near the workpiece, whereby a calculation has been used to predict the actual ion beam current, including neutrals. The present disclosure thus provides an advantage by further measuring the ion beam current as it enters into the optical element 146 at the final optical bend 150, as well as when the ion beam exits the optical element. Accordingly, in one example, an average of these two measurements can be utilized to infer the actual charge flux of the ion beam 112 at the position of the final optical bend 150. As such, while not precluded by the present disclosure, a software compensation factor need not be implemented in order to attain an accurate dose at the workpiece 118.

In another example, the ion implantation system 101 scans the ion beam 112 via an ion beam scanner 160 upstream of the final optical bend 150, whereby the first measurement apparatus 142 that is downstream of the optical element 146 may comprise one or more faraday cups (e.g., the ion beam 112 may be scanned across two faraday cups). In such an example, the second measurement apparatus 152 that is upstream of the optical element 146, whereby the ion beam current may be measured utilizing a terminal return current. For example, a comparison device 161 (e.g., the controller 130) is configured to compare a terminal current 162 from the power supply 110A (e.g., a terminal current measurement apparatus 164) associated with the terminal 102 and an energy filter current 166 from the power supply 110B (e.g., an energy filter current measurement apparatus 168) associated with the optical element 146 to measure an amount of positive charge that is leaving the terminal 102 and going into the optical element (e.g., an energy filter). The terminal return current, for example, can be thus defined by the difference between the terminal current 162 and the energy filter current 166, whereby a terminal return current measurement apparatus 169 can be collectively defined by the controller 130 and power supplies 110A, 110B to determine the terminal return current. Alternatively, a faraday apparatus (e.g., a stationary faraday apparatus) may be utilized as the second measurement apparatus 152, as well, whereby the ion beam 112 is scanned into the faraday for ion beam current measurement. The present disclosure contemplates any device, apparatus, or method for determining the ion beam current both before and after the optical element 146, such as a faraday measurement, a power supply subtraction, or any other beam current measurement that may be applied at the entrance and exit to the bending element.

In one example, the ion beam current that enters the optical element 146 is measured as the workpiece 118 is scanned via a workpiece scanning apparatus 170, whereby the workpiece scanning apparatus is configured to scan the workpiece through the ion beam 112 in one or more directions (e.g., illustrated as arrow 172). As such, an instantaneous velocity of the workpiece 118 moving through the ion beam 112 can be advantageously controlled to control the dosage of ions implanted into the workpiece in accordance with the present disclosure. The ion beam 112, for example, can be scanned at a fixed frequency and at a fixed waveform when the workpiece 118 is scanned therethrough. In the present non-limiting example, the speed of scanning of the ion beam 112 via the ion beam scanner 160 across the workpiece 118 is not varied; rather, the velocity of the mechanical scanning of the workpiece 118 through the ion beam 112 is selectively controlled via a control of the workpiece scanning apparatus 170.

Conventionally, the software compensation factor discussed above was utilized for control of dosage. For example, control was achieved by either monitoring a faraday in a position downstream of the bend, or by monitoring the faradays in the downstream position and applying software compensation on that signal in order to move the workpiece faster or slower than the signal would predict.

In accordance with the present disclosure, however, the ion beam current is monitored or measured at positions both before and after the optical element 146. The ion beam 112 has a tendency to neutralize as it travels along the path 144, and when the ion beam is measured downstream of the optical element 146, more reduction of beam current can be measured than is actually present. When the ion beam current is measured upstream of the optical element 146, however, as provided in the present disclosure, less reduction of ion beam current is measured than is actually present. By utilizing a measurement that is slightly less sensitive and one that is slightly more sensitive, a beam current change can be inferred at the actual position of the optical bend 150, or very close thereto, where charged ions present at that position can be assumed to be passed through to the workpiece 118. A faraday cannot typically be placed at the optical bend 150 due to its high voltage (e.g., up to 60 kv is utilized to bend the ion beam 112). As such, the present disclosure can be advantageously implemented to predict the ion beam current at the location of the optical bend 150.

The present disclosure appreciates that differences in current measurement from various measurements can be due to neutrals present in the ion beam 112. The present disclosure thus measures the ion beam current before an implant commences, and by summing due to the short duration of a vertical scan, the ion beam current measurement that is determined by real time signals can be attributed to outgassing effects from the workpiece 118. For example, by utilizing the first and second measurement apparatuses 142, 152, if there is a 1% change in the beam current coming from the ion source 108, both measurements decrease by 1%, whereby the scan velocity of the workpiece can decrease by 1%. Thus, upstream changes are evenly followed in both signals. However, if the signal is impacted by outgassing of the photoresist from the workpiece 118, for example, the downstream signal will overestimate how much the workpiece should be slowed, and the upstream will underestimate, whereby an average the over/under can be utilized in order to determine an accurate scan velocity.

A photoresist or coating on the workpiece 118 is commonly utilized to mask the workpiece in order to implant a desired area of the workpiece. However, in a very high beam current ion implanter, the power going into the photoresist is substantial, and a large pressure response is experienced, thus causing significant neutralization of the ion beam 112. As more naturalization is experienced, more accuracy is needed to determine how many neutrals are passed to the workpiece 118, and how many are filtered out at the final optical bend 150. High power implants can cause the photoresist to outgas, thus increasing the pressure due to the material that is evaporated out of the photoresist. The ion beam 112, for example, will attenuate through a residual gas, whether the residual gas is from a photoresist, a nitrogen leak, or other gas, whereby if a portion of the ion beam strikes such molecules, a number of effects are experienced, such as a neutralization of the ion beam, an ionization of the background gas, and so forth. However, for dosimetry, the effect of concern is the neutralization of the ion, since due to suppression voltages, low energy ions that are formed in the reaction are not measured. Furthermore, neutrals do not have a charge, and are also not steerable, whereas it is otherwise desirable to steer the ion beam 112 by magnetic or electrostatic forces. As such, neutrals existing in the ion beam 112 prior to the optical element 146 continue straight to a graphite dump, while neutrals existing in the ion beam after the optical element will continue a line-of-sight to the workpiece.

Accordingly, the present disclosure provides hardware to determine how many ions are present at the position of the final optical bend 150, whereby all of the ions at the bend will have a line-of-sight path to the workpiece, even if they neutralize after the bend. Anything that is already neutralized before the optical bend 150 does not have line-of-sight to the workpiece 118 and gets filtered out.

While the present disclosure further contemplates optional incorporation of a software compensation factor for fine tuning, the present disclosure can advantageously infer the ion beam current at the final optical bend 150 that can be accurate enough just hardware, alone, and without necessitating software compensation. The path lengths from the second measurement apparatus 152 upstream of the optical element 146 and from the optical element to the first measurement apparatus downstream of the optical element are non-zero, however, so it is appreciated that there may be some change at the optical bend 150 (e.g., each species and energy has a different cross section for neutralization). The present disclosure appreciates that a "perfect" position to measure ion beam current is directly at the optical bend 150, but due to the nature of the bending element discussed above, such a position is better inferred by the system and method of the present disclosure.

Thus, the present disclosure thus minimizes the distances from the optical element 146 to the measurement locations in order to not necessitate the inclusion of a software compensation factor; but again, software compensation can still be utilized for fine tuning. In one example, a target of less than 1% average shift between a bare workpiece 118 (e.g., no photoresist producing an outgassing effect) and any photoresist outgassing condition. In some cases, the system may be fine-tuned to almost exactly the bare workpiece scenario by software compensation. For example, an upstream signal is used (e.g., a beam current measurement), whereby the beam current decreases in that signal when the beam current decreases on the workpiece 118. In this case, because the upstream signal and downstream signal are both attenuating the same direction, there is no risk of overcorrecting in the wrong direction by a calculation error, as seen in the prior systems.

Thus, the present disclosure measures the beam current before and after the optical bending element, and then uses those measurements, and optionally, a weighting factor to determine the beam current and velocity of the workpiece 118 traveling through the ion beam. While a straight average of the upstream and downstream beam current measurements can be utilized to infer the beam current, a weighted average can be further utilized for fine tuning.

Figure 6:
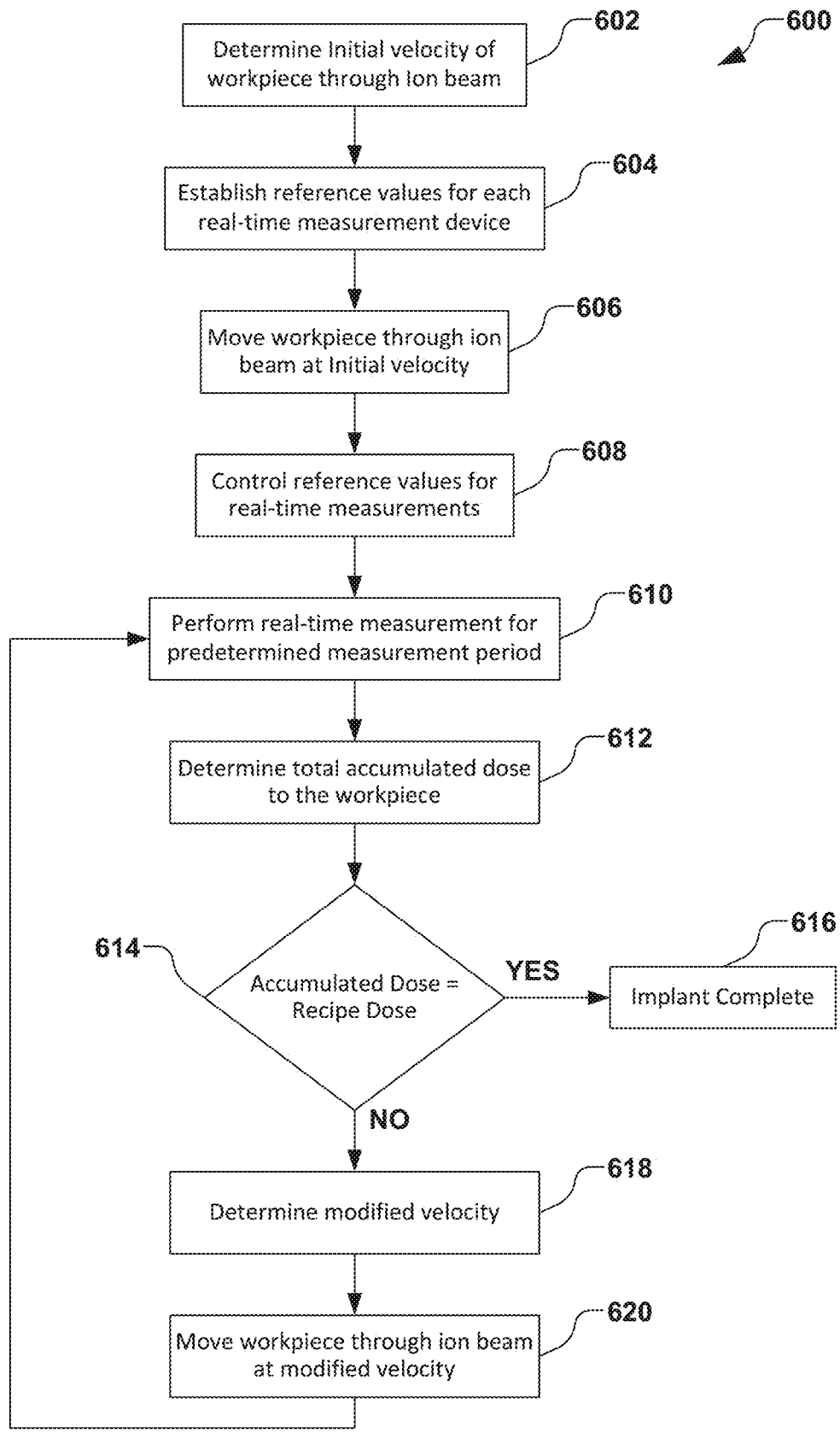
FIG. 6 is a flowchart illustrating a method for inferring beam current at a bend of an optical element for real-time dose control of an ion implantation according to another example.

In accordance with another exemplary aspect, a method 600 is provided in FIG. 6 for providing real-time dose control in an ion implantation into a workpiece. It should be noted that while exemplary methods are illustrated and described herein as a series of acts or events, it will be appreciated that the present disclosure is not limited by the illustrated ordering of such acts or events, as some steps may occur in different orders and/or concurrently with other steps apart from that shown and described herein, in accordance with the disclosure. In addition, not all illustrated steps may be required to implement a methodology in accordance with the present disclosure. Moreover, it will be appreciated that the methods may be implemented in association with the systems illustrated and described herein as well as in association with other systems not illustrated.

It should be noted that the controller 130 of FIG. 1 may be configured to perform the method 600 of FIG. 6, whereby control of various components discussed above may be achieved in the manner described herein. As illustrated in FIG. 6, the exemplified method 600 begins at act 602, wherein an initial velocity of a workpiece through an ion beam is determined. In act 604, reference values for each real-time measurement apparatus are established. For example, reference values for the first and second measurement apparatuses 142, 152 of FIG. 1 are established in act 604. In act 606 of FIG. 6, the workpiece is translated through the ion beam at an initial velocity, such as via the workpiece scanning apparatus 170 of FIG. 1.

In act 610 of FIG. 6, real-time measurements are performed for a predetermined measurement period. For example, act 610 may comprise attaining beam current measurements of the ion beam 112 via the first and second measurement apparatuses 142, 152 and by a control scheme associated with the controller 130. In act 612 of FIG. 6, a total accumulated dose of ions on the workpiece is determined. In act 614, the accumulated dose determined in act 612 is compared to a desired dosage of ions to be implanted for a particular time during the implantation. If the accumulated dosage of ions is determined to be equal to the desired dosage of ions (e.g., within a predetermined margin) in act 614, the implantation is deemed complete in act 616. If, however, the accumulated dosage of ions is determined to not be equal to the desired dosage of ions into the workpiece, a modified velocity of the translation of the workpiece through the ion beam is determined in act 618. For example, the determination of the modified velocity can be based on the previously-attained beam current measurements, previous velocity of the workpiece, and/or other factors.

In act 620, the workpiece is translated through the ion beam at the modified velocity, whereby the workpiece is further implanted with ions. The method 600 then proceeds again to act 610, whereby the real-time measurements are again attained, the total accumulated dose is determined again in act 612, and the accumulated dose is again compared to the desired dose in act 614. The process continues until the implantation is deemed to be complete in act 616, as described above.

Although the invention has been shown and described with respect to a certain embodiment or embodiments, it should be noted that the above-described embodiments serve only as examples for implementations of some embodiments of the present invention, and the application of the present invention is not restricted to these embodiments. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application. Accordingly, the present invention is not to be limited to the above-described embodiments, but is intended to be limited only by the appended claims and equivalents thereof.

The invention claimed is:

1. An ion implantation system, comprising:
an ion source configured to form an ion beam;
a mass analyzer configured to mass analyze the ion beam;

a bending element downstream of the mass analyzer;
a first measurement apparatus positioned downstream of the bending element and configured to determine a first ion beam current of the ion beam;
a second measurement apparatus positioned upstream of a final optical bend and configured to determine a second ion beam current of the ion beam, wherein the second measurement apparatus comprises one or more of a terminal return current measurement apparatus and an energy filter current measurement apparatus;
a workpiece scanning apparatus configured to scan a workpiece through the ion beam; and
a controller configured to determine an implant current of the ion beam at the workpiece and to control the workpiece scanning apparatus to control a scan velocity of the workpiece based on the implant current, wherein the determination of the implant current of the ion beam is based, at least in part, on the first ion beam current and second ion beam current.

2. The ion implantation system of claim 1, wherein the first measurement apparatus comprises a faraday.

3. The ion implantation system of claim 1, further comprising a beam scanning apparatus configured to scan the ion beam along one or more axes.

4. The ion implantation system of claim 1, wherein the controller is further configured to implement a software compensation factor to further control the scan velocity of the workpiece.

5. The ion implantation system of claim 1, wherein the controller is configured to determine the implant current by determining an average of the first ion beam current and second ion beam current.

6. The ion implantation system of claim 5, wherein the controller is further configured to determine the implant current by weighting the average of the first ion beam current and second ion beam current.

7. The ion implantation system of claim 1, wherein the controller is further configured to repeatedly determine the implant current at a predetermined rate, and wherein the scan velocity is updated at the predetermined rate.

8. The ion implantation system of claim 7, wherein the predetermined rate is on the order of once every 1-50 milliseconds.

9. An ion implantation system, comprising:
an ion source configured to form an ion beam;
a mass analyzer configured to mass analyze the ion beam;
a bending element downstream of the mass analyzer;
a first measurement apparatus positioned downstream of the bending element and configured to determine a first ion beam current of the ion beam;
a second measurement apparatus positioned upstream of a final optical bend and configured to determine a second ion beam current of the ion beam, wherein the second measurement apparatus comprises a comparison device configured to compare a terminal current associated with a terminal of the ion source and an energy filter current associated with an energy filter;
a workpiece scanning apparatus configured to scan a workpiece through the ion beam; and
a controller configured to determine an implant current of the ion beam at the workpiece and to control the workpiece scanning apparatus to control a scan velocity of the workpiece based on the implant current, wherein the determination of the implant current of the ion beam is based, at least in part, on the first ion beam current and second ion beam current.

10. The ion implantation system of claim 9, wherein the bending element comprises the energy filter.

11. The ion implantation system of claim 9, wherein the first measurement apparatus comprises one or more faradays positioned downstream of the bending element.

12. The ion implantation system of claim 9, wherein the first measurement apparatus comprises two faradays positioned downstream of the bending element on opposing sides of the ion beam.

13. An ion implantation system for implanting ions into a workpiece, the ion implantation system comprising:
an ion source configured to form an ion beam;
a mass analyzer configured to mass analyze the ion beam;
a bending element positioned downstream of the mass analyzer and configured to bend a trajectory of the ion beam;
a first measurement apparatus positioned downstream of the bending element and configured to determine a first ion beam current of the ion beam;
a second measurement apparatus positioned upstream of a final optical bend and configured to determine a second ion beam current of the ion beam, wherein the second measurement apparatus comprises one or more of a terminal return current measurement apparatus and an energy filter current measurement apparatus; and
a controller configured to determine an implant current of the ion beam at the workpiece based, at least in part, on the first ion beam current and second ion beam current.

14. The ion implantation system of claim 13, wherein the first measurement apparatus comprises a faraday.

15. The ion implantation system of claim 13, wherein the controller is configured to average the first ion beam current and second ion beam current.

16. The ion implantation system of claim 13, further comprising a workpiece scanning apparatus configured to scan the workpiece through the ion beam, and wherein the controller is further configured to control the workpiece scanning apparatus to control a scan velocity of the workpiece based on the implant current.

17. An ion implantation system for implanting ions into a workpiece, the ion implantation system comprising:
an ion source configured to form an ion beam;
a mass analyzer configured to mass analyze the ion beam;
a bending element positioned downstream of the mass analyzer and configured to bend a trajectory of the ion beam;
a first measurement apparatus positioned downstream of the bending element and configured to determine a first ion beam current of the ion beam;
a second measurement apparatus positioned upstream of a final optical bend and configured to determine a second ion beam current of the ion beam, wherein the second measurement apparatus comprises a comparison device configured to compare a terminal current associated with a terminal of the ion source and an energy filter current associated with an energy filter; and
a controller configured to determine an implant current of the ion beam at the workpiece based, at least in part, on the first ion beam current and second ion beam current.

18. The ion implantation system of claim 17, wherein the bending element comprises the energy filter.

19. The ion implantation system of claim 17, wherein the first measurement apparatus comprises one or more faradays positioned downstream of the bending element.

* * * * *